United States Patent
McNurlin et al.

(10) Patent No.: US 6,752,442 B2
(45) Date of Patent: Jun. 22, 2004

(54) WORKPIECE HANDLING END-EFFECTOR AND A METHOD FOR PROCESSING WORKPIECES USING A WORKPIECE HANDLING END-EFFECTOR

(75) Inventors: Randy McNurlin, Phoenix, AZ (US); Mark Maggio, Phoenix, AZ (US); Michael Smigel, Phoenix, AZ (US); Ann Wilkey, Phoenix, AZ (US); James L. Farmer, Tempe, AZ (US); Shawn Robertson, Phoenix, AZ (US)

(73) Assignee: SpeedFam-IPEC Corporation, Chandler, AZ (US)

( * ) Notice: Subject to any disclaimer, the term of this patent is extended or adjusted under 35 U.S.C. 154(b) by 83 days.

(21) Appl. No.: 10/040,996

(22) Filed: Nov. 9, 2001

(65) Prior Publication Data

US 2003/0092358 A1 May 15, 2003

(51) Int. Cl.[7] .............................. B66C 1/10; B25J 15/08
(52) U.S. Cl. .......................... 294/106; 294/90; 414/739; 414/941; 901/39
(58) Field of Search ......................... 294/90, 94, 103.1, 294/104, 106, 86.4, 119.1; 414/736, 737, 739, 941; 901/37, 39; 451/5

(56) References Cited

U.S. PATENT DOCUMENTS

| 5,445,486 | A | | 8/1995 | Kitayama et al. ........... 414/937 |
|---|---|---|---|---|
| 5,636,964 | A | | 6/1997 | Somekh et al. ............. 414/937 |
| 5,647,626 | A | | 7/1997 | Chen et al. ................. 414/937 |
| 5,702,292 | A | | 12/1997 | Brunelli et al. ............... 451/41 |
| 5,851,041 | A | | 12/1998 | Anderson et al. ........... 294/106 |
| 5,906,754 | A | | 5/1999 | Appel et al. .................. 216/88 |
| 5,947,802 | A | | 9/1999 | Zhang et al. ............... 451/334 |
| 5,954,072 | A | * | 9/1999 | Matusita ...................... 414/941 |
| 5,955,858 | A | | 9/1999 | Kroeker et al. ............... 294/94 |
| 6,131,589 | A | | 10/2000 | Vogtmann et al. .......... 414/936 |
| 6,167,893 | B1 | * | 1/2001 | Taatjes et al. .............. 414/941 |
| 6,267,853 | B1 | * | 7/2001 | Dordi et al. ................. 204/232 |
| 6,273,484 | B1 | * | 8/2001 | Peng .......................... 294/86.4 |
| 2002/0071756 | A1 | * | 6/2002 | Gonzalez ..................... 414/941 |

FOREIGN PATENT DOCUMENTS

| JP | 402288247 | * | 11/1990 | ................. 414/941 |
|---|---|---|---|---|

* cited by examiner

Primary Examiner—Eileen D. Lillis
Assistant Examiner—Paul T. Chin
(74) Attorney, Agent, or Firm—Ingrassia Fisher & Lorenz, P.C.

(57) ABSTRACT

A two sided wafer handling end-effector provides for the efficient loading and unloading of wafers into and out of a wafer processing apparatus. Each side of the end-effector includes spaced apart rotatable catch mechanisms between which a wafer is firmly grasped. When the end-effector is positioned beneath the wafer processing apparatus, the catch mechanisms are rotated to an open position and a lifting surface on the catch mechanisms lifts the wafer into the wafer processing apparatus. When the catch mechanisms are in the open position, the wafer is centered on the end-effector by rotatable rocker assemblies that contact the edge of the wafer. As the end-effector is raised into contact with the processing apparatus, the rocker assemblies rotate to a lowered position in the end-effector while arcuate surfaces on the assemblies maintain contact with the wafer edge.

25 Claims, 11 Drawing Sheets

WORKPIECE HANDLING END-EFFECTOR AND A METHOD FOR PROCESSING WORKPIECES USING A WORKPIECE HANDLING END-EFFECTOR

FIELD OF THE INVENTION

This invention relates generally to an end-effector for handling a workpiece, and more specifically, in one embodiment, to a workpiece handling end-effector for efficiently loading and unloading workpieces into and from a processing apparatus and to a method for processing workpieces using such an end-effector.

BACKGROUND OF THE INVENTION

Many manufacturing processes require the automated loading and unloading of workpieces into and out of a processing apparatus. In the interest of reducing cost and increasing productivity, such movement of workpieces is often accomplished with the aid of a workpiece handling end-effector (sometimes referred to as a "wand") on the end of a robotic arm.

One example of such a manufacturing process is the planarization of a surface of a workpiece, a process that finds application in the manufacture of many types of products such as semiconductor wafers, optical blanks, memory disks, and the like. Chemical mechanical planarization (CMP) is one accepted method for achieving a planar surface on such workpieces. The CMP method typically requires the workpiece to be loaded into and mounted precisely on a carrier head in a manner such that the surface to be planarized is exposed. The exposed side of the workpiece is then held against a polishing pad and a relative motion is initiated between the workpiece surface and the polishing pad in the presence of a polishing slurry. Typically, the workpieces are processed in batches or lots that include a plurality of workpieces. For example, with the CMP processing of semiconductor wafers, each of the wafers in a lot must be sequentially loaded from a wafer cache onto the carrier head for planarization. Following the planarization, each wafer is unloaded from the carrier head and again placed in a wafer cache or is directly transferred to a subsequent processing apparatus such as a cleaning station. The loading and unloading operations are accomplished using a wafer handling end-effector.

With many workpieces, and certainly with semiconductor device wafers, the surfaces of the workpieces can be easily damaged if the handling end-effector contacts the surface. Because of this, the end-effector should preferably contact only the edge of the workpiece or, or at most, the surface within a narrow distance from the edge. This requirement is made even more significant by the current migration of the semiconductor industry from 200 mm (8 inch) to 300 mm (12 inch) wafers. As part of this change, the semiconductor industry has adopted new wafer-handling standards for 300 mm wafers that preclude all contact with the major surfaces of a wafer, and tighten limitations as to the extent of the wafer that may be contacted at the wafer edge. Thus, known vacuum type end effectors, or other end effectors that grip or touch the back surface of the wafer are not allowed. Also, the available surface area for fabrication of the electronic devices on a 300 mm wafers is more than double that of 200 mm wafers. The cost of 300 mm wafers increases proportionately to the increase in wafer area, placing a premium on the reliability and safety of wafer handling systems and end-effectors. In addition, 300 mm wafers are proportionally heavier than 200 mm wafers, adding still more demands on the mechanical integrity, precision, and reliability of the end-effector. Existing end-effector designs do not satisfactorily meet these new design and reliability requirements for 300 mm wafers.

Loading a workpiece into a chemical mechanical planarization apparatus presents problems for conventional workpiece handling end-effectors because of the nature of the CMP carrier head. The conventional CMP carrier head includes a flexible diaphragm against which the back surface (the surface that is not to be polished) is pressed. The flexible diaphragm is surrounded by an annular wear ring or retaining ring having an inner diameter only slightly greater than the diameter of the workpiece to be polished. The diaphragm and the wear ring form a cavity into which the workpiece must be loaded. To carry out the planarization operation, the workpiece must be mounted against the diaphragm within the confines of the wear ring while contacting only the edges or near edge surfaces of the workpiece. In the CMP processing of a 200 mm (8 inch) or 300 mm (12 inch) semiconductor wafer, the clearance between the inner diameter of the wear ring and the outer diameter of the semiconductor wafer is typically less than 1 mm. The recess into which the semiconductor wafer must be loaded has a depth on the order of the thickness of the wafer itself, or about 0.75 mm.

Many other types of processing apparatus also require a workpiece to be loaded into a recessed space with a high degree of positional accuracy and without adversely contacting the surfaces of the workpiece. Accordingly, there exists a need for a workpiece handling end-effector that can load workpieces into and unload workpieces from a workpiece processing apparatus with a high degree of precision and without adversely contacting the critical surfaces of the workpiece. There also exists a need for a method for processing workpieces in an efficient manner using such a workpiece handling end-effector.

DETAILED DESCRIPTION OF PREFERRED EMBODIMENTS OF THE INVENTION

Figure 1:
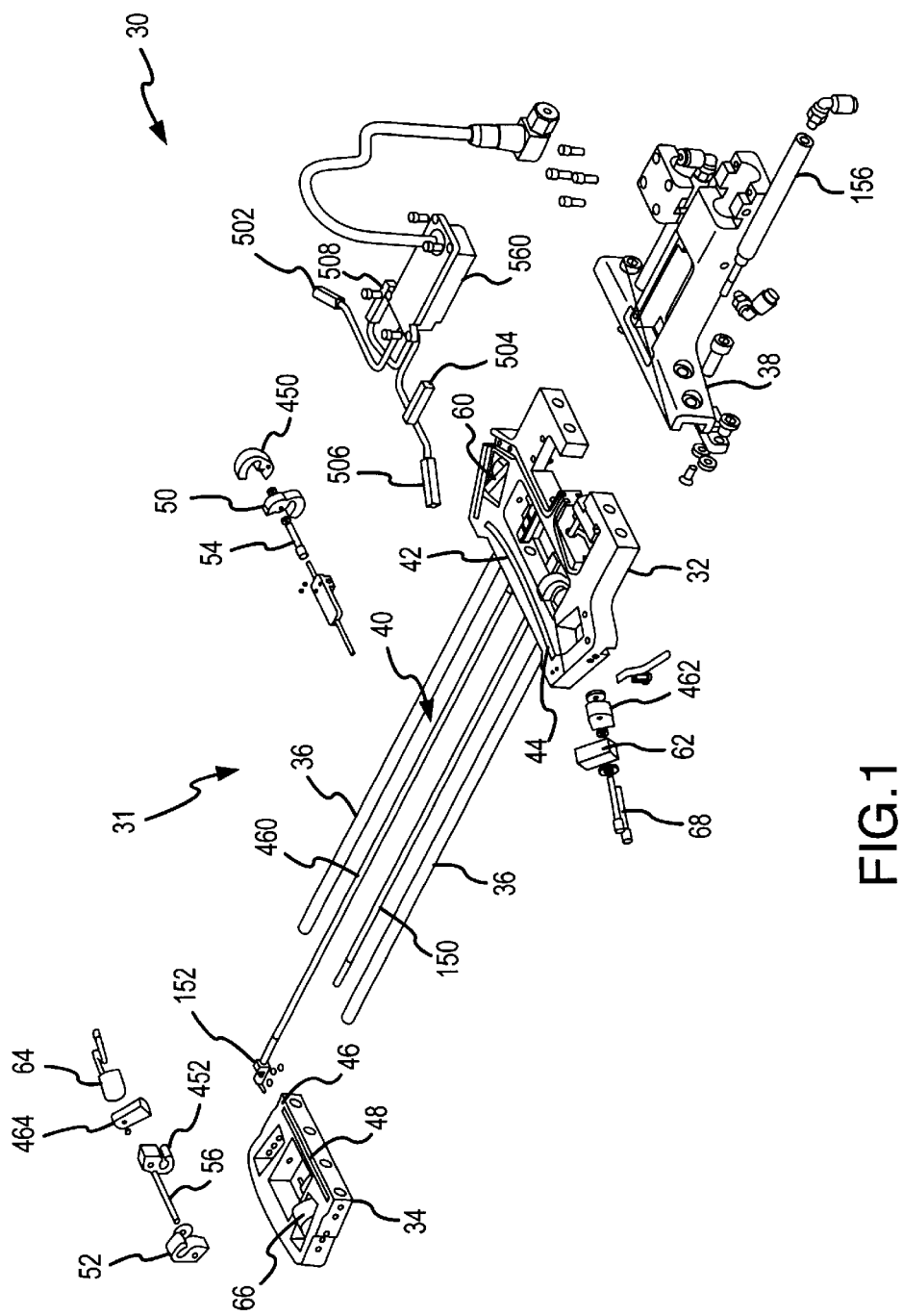
FIGS. 1 and 2 illustrate, in exploded perspective view and perspective view, respectively, a workpiece handling end-effector in accordance with one embodiment of the invention.

In accordance with one embodiment of the invention, a workpiece handling end-effector is provided that facilitates the accurate loading of an unprocessed workpiece into a processing apparatus and the unloading of a processed workpiece from that apparatus following a processing operation. In accordance with a further embodiment of the invention, a two sided workpiece handling end-effector is provided that facilitates the loading and unloading operations. One embodiment of the invention further includes a method, using a workpiece handling end-effector, for processing workpieces.

The drawing figures are intended to illustrate the general manner of construction of the inventive apparatus and are not necessarily to scale. In the description and in the claims, the terms such as up, down, upper, lower, top, bottom, and the like are used for descriptive purposes. However, it is understood that the embodiments of the invention described herein are capable of operation in other orientations than as shown, and the terms so used are only for the purpose of describing relative positions and are interchangeable under appropriate circumstances. For purposes of illustration only, the invention will be described as it applies to a CMP apparatus and to a CMP process and specifically as they apply to the CMP processing of a semiconductor wafer. It is not intended, however, that the invention be limited to these illustrative embodiments; instead, the invention is applicable to a variety of processing apparatus and to the processing and handling of many types of workpieces.

Figure 2:
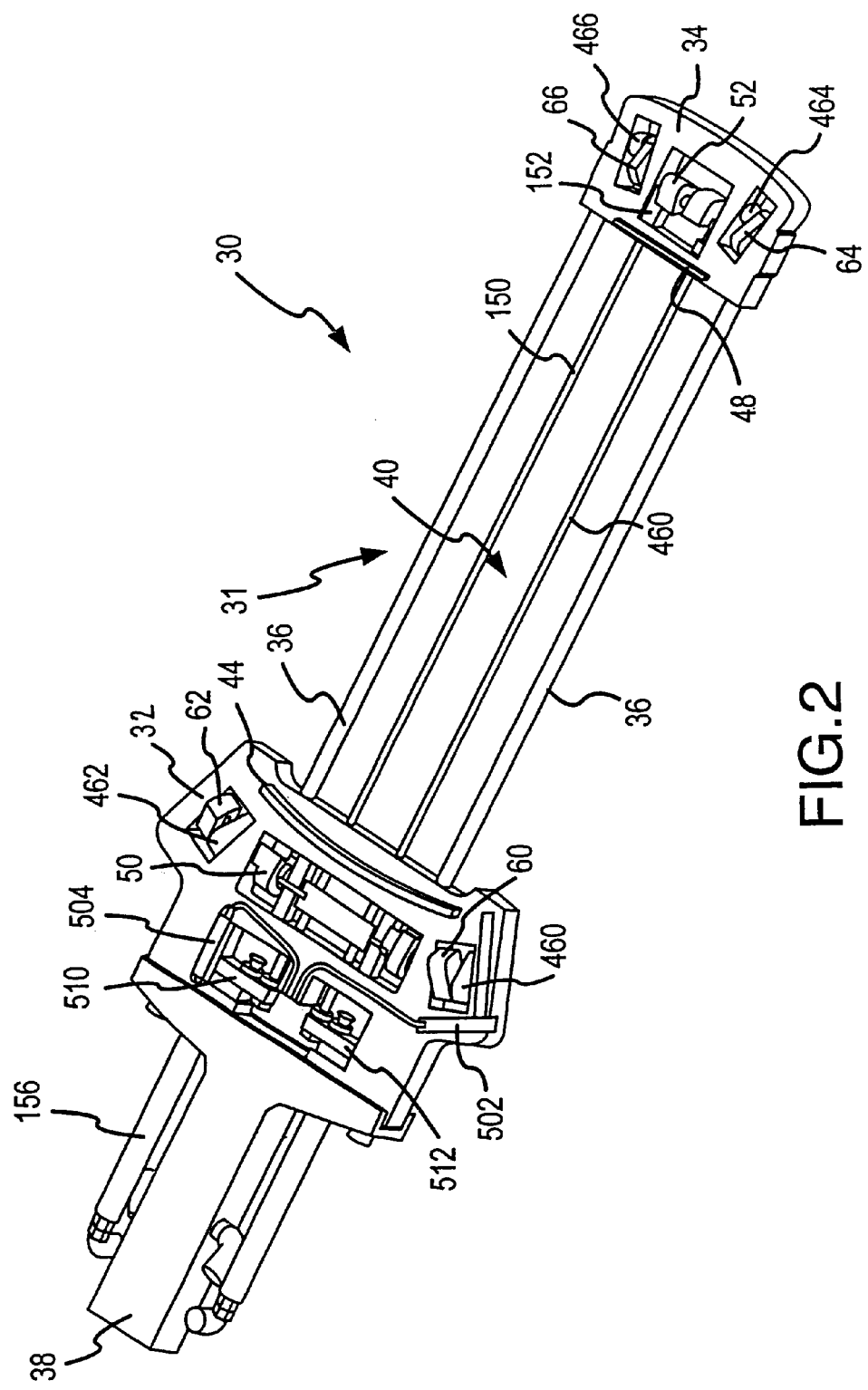

FIG. 1 illustrates, in exploded perspective view, and FIG. 2 illustrates, in perspective view, a workpiece handling end-effector 30 in accordance with one embodiment of the invention. End-effector 30, in accordance with a preferred embodiment of the invention, is two sided, with identical configurations on the top and bottom surfaces of the end-effector. The two sided end-effector contributes to processing efficiencies as will be explained more fully below. Although the invention will be described and illustrated with reference to a two sided end-effector, the invention can also be implemented as a single sided end-effector (not illustrated).

As will be explained more fully below, end-effector 30 includes a workpiece support area within which a workpiece can be positioned. The support area is configured so that only the edges and the outer periphery of the surface of the workpiece are contacted, preventing damage to the surface of the workpiece. Rotatable catch mechanisms, in a closed position, grasp the workpiece and hold it within the support area, allowing the workpiece to be moved, for example, from a workpiece cache to a location in proximity to a workpiece processing apparatus. In an open position the catch mechanisms allow a workpiece to be loaded onto or removed from the end-effector. In accordance with one embodiment of the invention, when end-effector 30 and a workpiece grasped thereon are moved near to and in alignment with the workpiece processing apparatus, the catch mechanisms are rotated to an open position. End-effector 30 also includes a workpiece centering assembly that can maintain a workpiece centered within the support area of the end-effector when the catch mechanisms are in the open and non-gripping position and as the workpiece is loaded into the processing apparatus. In one embodiment of the invention the workpiece centering assembly consists of inclined surfaces disposed at opposite ends of the support area. The inclined surfaces may be straight, or arcuate, and are positioned to trap the wafer by contact with the wafer edge. In a preferred embodiment, the workpiece centering assembly comprises a set of rocker assemblies. As the end-effector and the workpiece are moved toward the workpiece processing apparatus, the rocker assemblies each rotate to lowered positions so as not to interfere with the loading operation. The rocker assemblies each have an arcuate surface configured such that as the assemblies rotate, the surface maintains contact with the edge of the workpiece to maintain the workpiece in proper alignment. Although the end-effector described herein is suitable for use with any size of workpiece, it is particularly suited for handling 300 mm workpieces. In that case the catch mechanisms and rocker assemblies are preferably spaced about 300 mm apart.

End-effector 30 includes an elongate gripping assembly 31 with a base member portion 32 that is attached to a handle 38 that supports the end-effector and that, in turn, is attached to a robot arm (not illustrated) that can be used to control the positioning of the end-effector. As is well known, manufacturing robots are readily available that can control the positioning of the end-effector to the degree of accuracy necessary for the proper alignment of the end-effector and a wafer attached thereto as that wafer is loaded into a CMP processing apparatus. A second base member or nose member portion 34 is spaced apart from base 32 by support rods 36. The area between the spaced apart base members defines a wafer (or generally, a workpiece) support area 40. Alternatively to using rods 36, the gripping assembly 31 could be one integral piece comprising the base portion 32, nose portion 34, and an intermediate integral body portion (not shown). In accordance with one embodiment, base member 32 has a plane surface 42 and nose member 34 has a plane surface 46 upon which a wafer can be positioned. Preferably the plane surfaces are shaped and configured so that only a narrow portion of the surface near the edge of a wafer contacts the plane surfaces. In a preferred embodiment of the invention, base member 32 also includes a raised ridge 44 that extends above plane surface 42 and nose member 34 includes a raised ridge 48 that extends above plane surface 46. Each of the raised ridges can have a height above the respective plane surfaces of, for example, about 1 mm, a height slightly greater than the thickness of the wafer. Each of the ridges is configured and located so that the ridges contact only the extreme outer portion of the surface of a wafer placed in the wafer support area. For example, the ridges can be located so as to contact no more than the outer 1–2 mm of the wafer surface.

Figure 3:
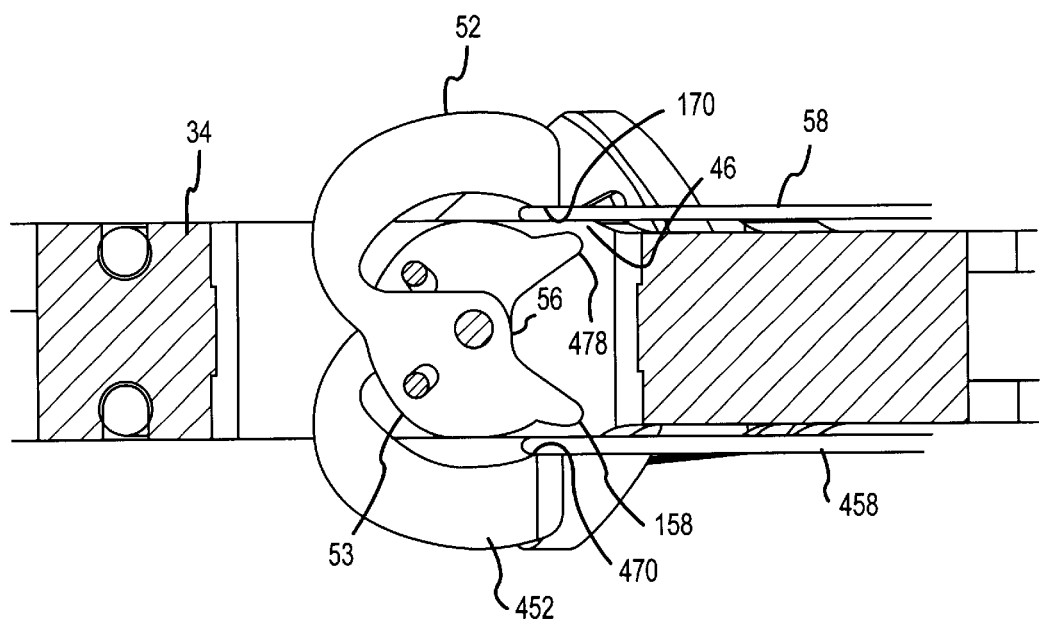
FIGS. 3 and 4 illustrate, in side view, a catch mechanism in closed and open positions, respectively, in accordance with one embodiment of the invention.
Figure 4:
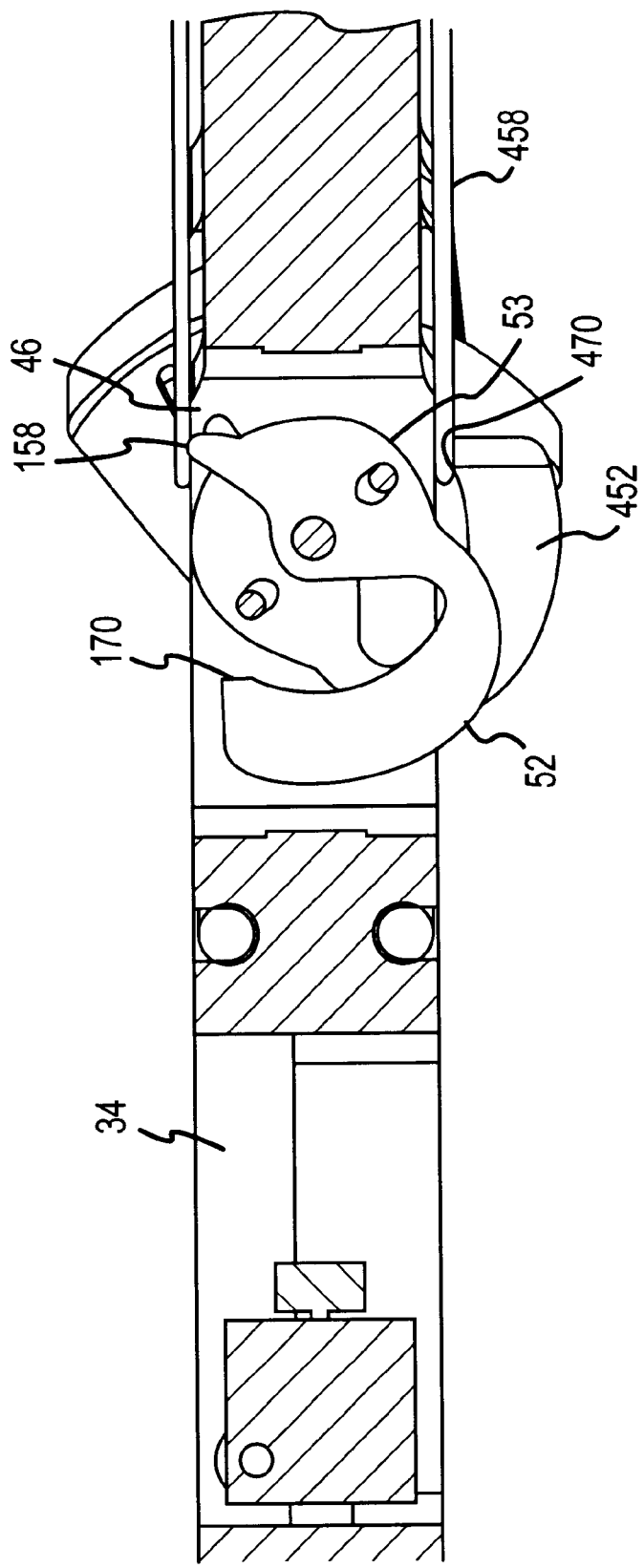
Figure 5:
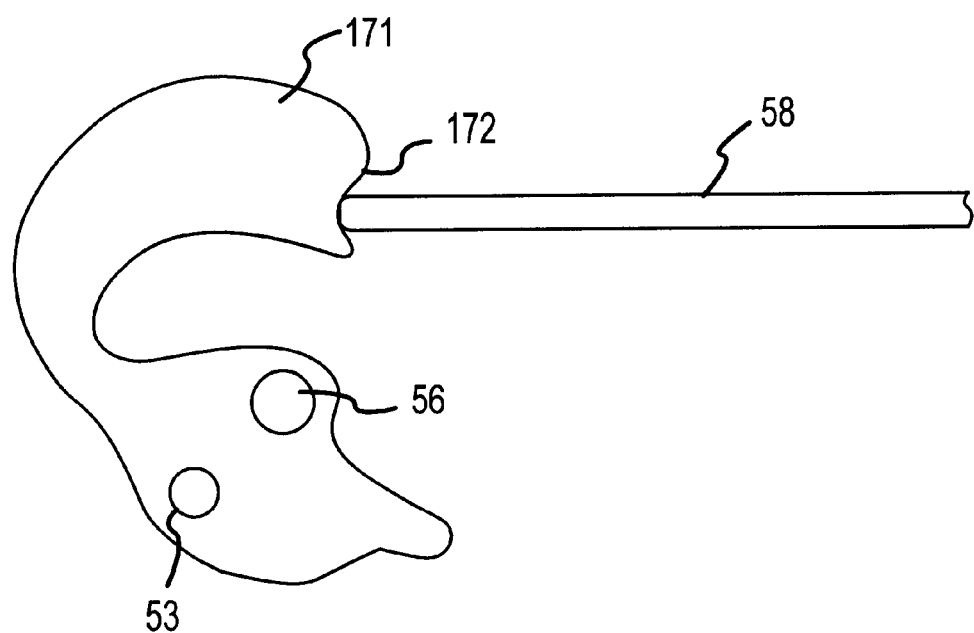
FIG. 5 illustrates, in side view, a catch mechanism in closed position in accordance with a further embodiment of the invention.

Base member 32 includes a base catch mechanism 50 and nose member 34 includes a nose catch mechanism 52. The two catch mechanisms are positioned to contact opposite edges of a wafer and to secure the wafer between the catch mechanisms. The base catch mechanism is configured to rotate about an axis 54 extending through base member 32 between a closed position and an open position. In similar manner, the nose catch mechanism is configured to rotate between a closed position and an open position about an axis 56 extending through nose member 34. When the catch mechanisms are in the closed position, as more clearly seen in FIG. 3, which illustrates nose catch mechanism 52 in side view, the catch mechanisms contact opposite sides of a wafer 58 and positively grip the wafer. With the catch mechanisms in the closed position, the wafer can be safely moved, for example, to and from a processing apparatus and/or to and from a wafer cache. FIG. 4 illustrates, also in side view, nose catch mechanism rotated to the open position. The catch mechanisms can be configured with a contacting surface 170 which, when the catch mechanism is in the closed position, contacts the outer portion of the upper surface of wafer 58 and holds the wafer against either the plane surfaces of the base member and nose member or against the raised ridges of the base and nose members, if so provided. Preferably the contacting of the surfaces of wafer 58 is limited, on both surfaces of the wafer, to the outermost 1–2 mm of the surface. Alternatively, as illustrated in FIG. 5, a catch mechanism 171 can be configured with a concave surface 172 which spans the edge of wafer 58 without substantially contacting either the upper or lower surface of the wafer. Accordingly, the wafer is grasped by the edges thereof between a base catch mechanism and a nose catch mechanism such as catch mechanism 171.

Figure 6:
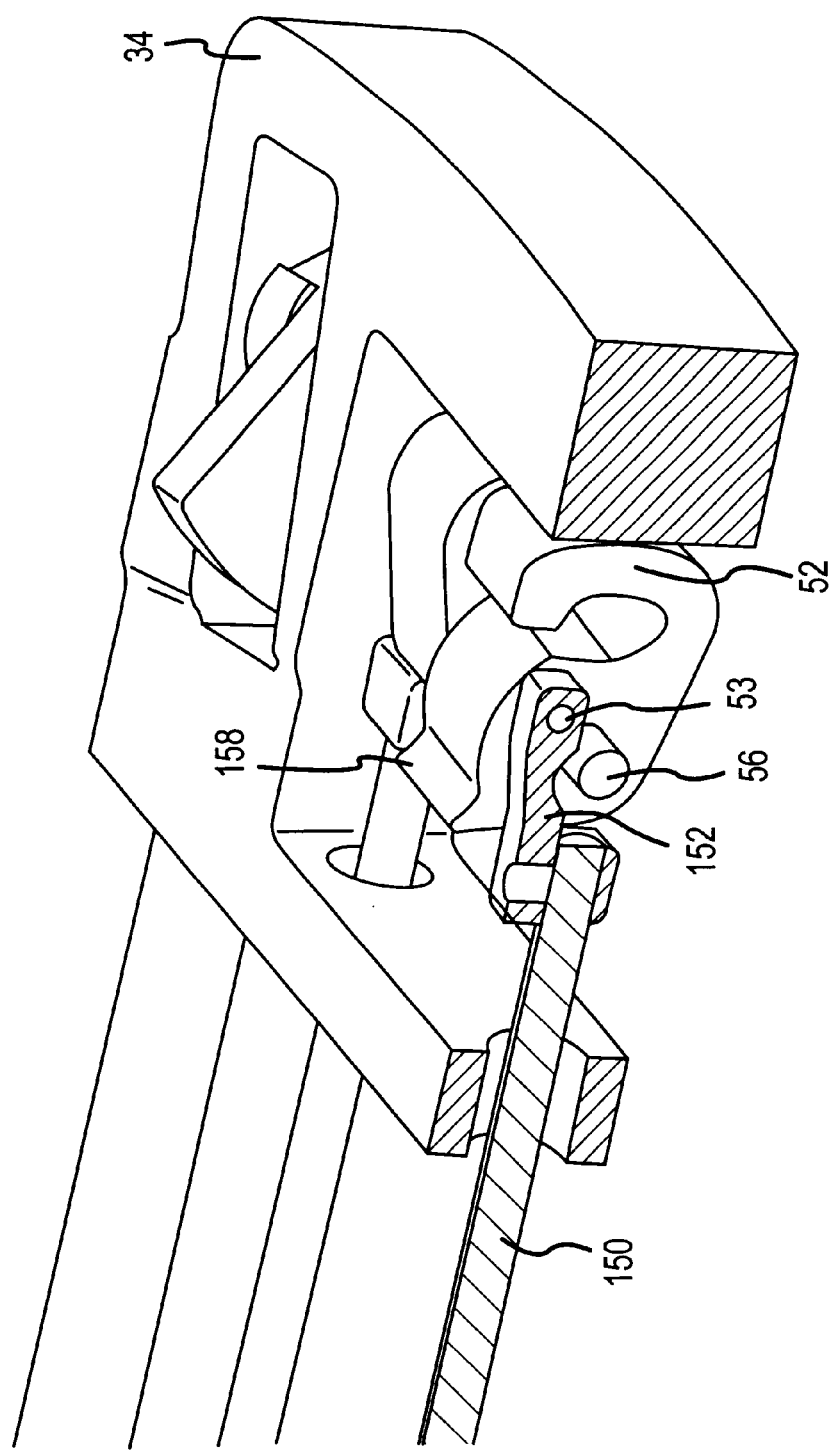
FIGS. 6 and 7 illustrate, in partially cut away perspective, coupling of a drive rod to a nose catch mechanism with the catch mechanism in the open and closed positions, respectively, in accordance with one embodiment of the invention.
Figure 7:
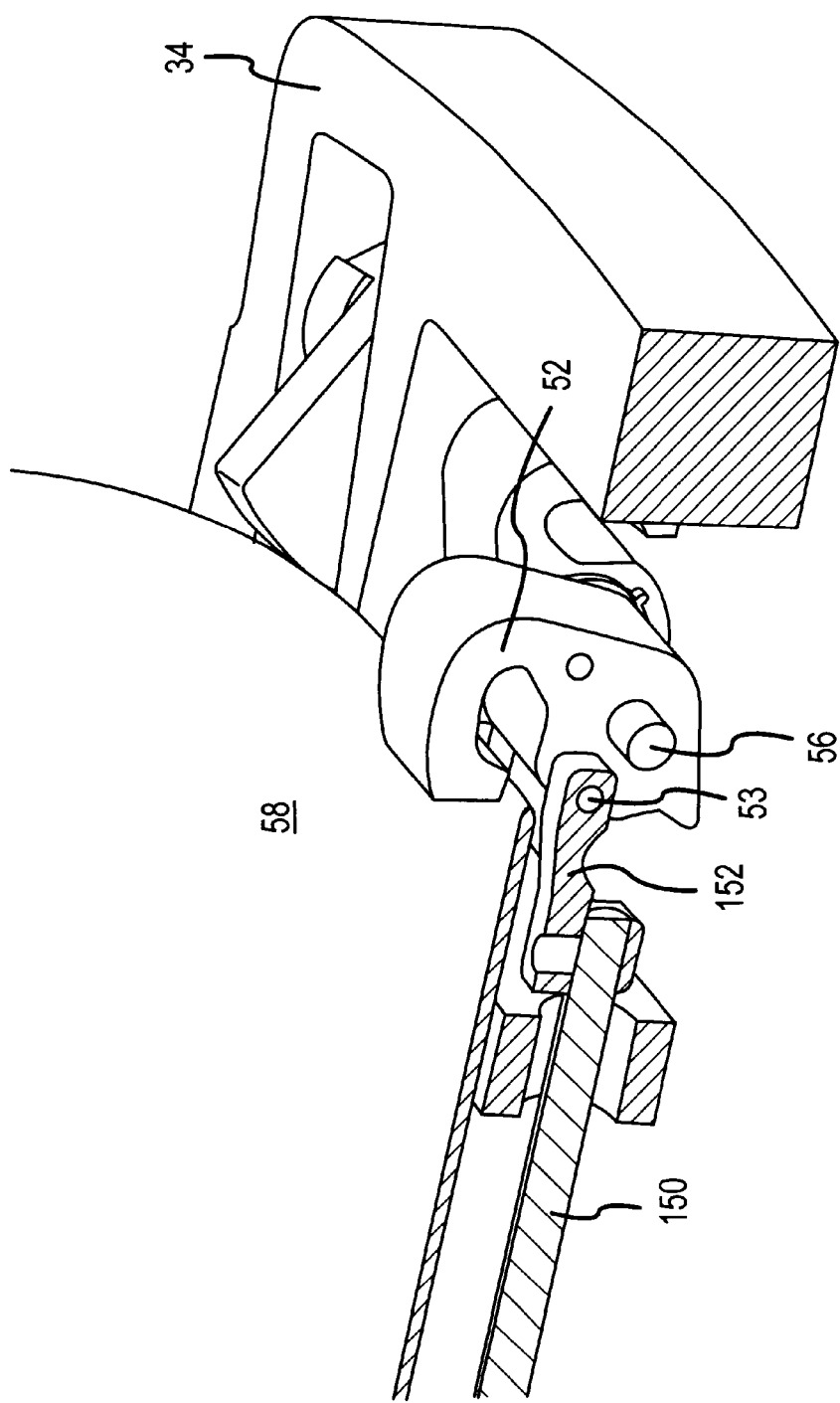
Figure 8:
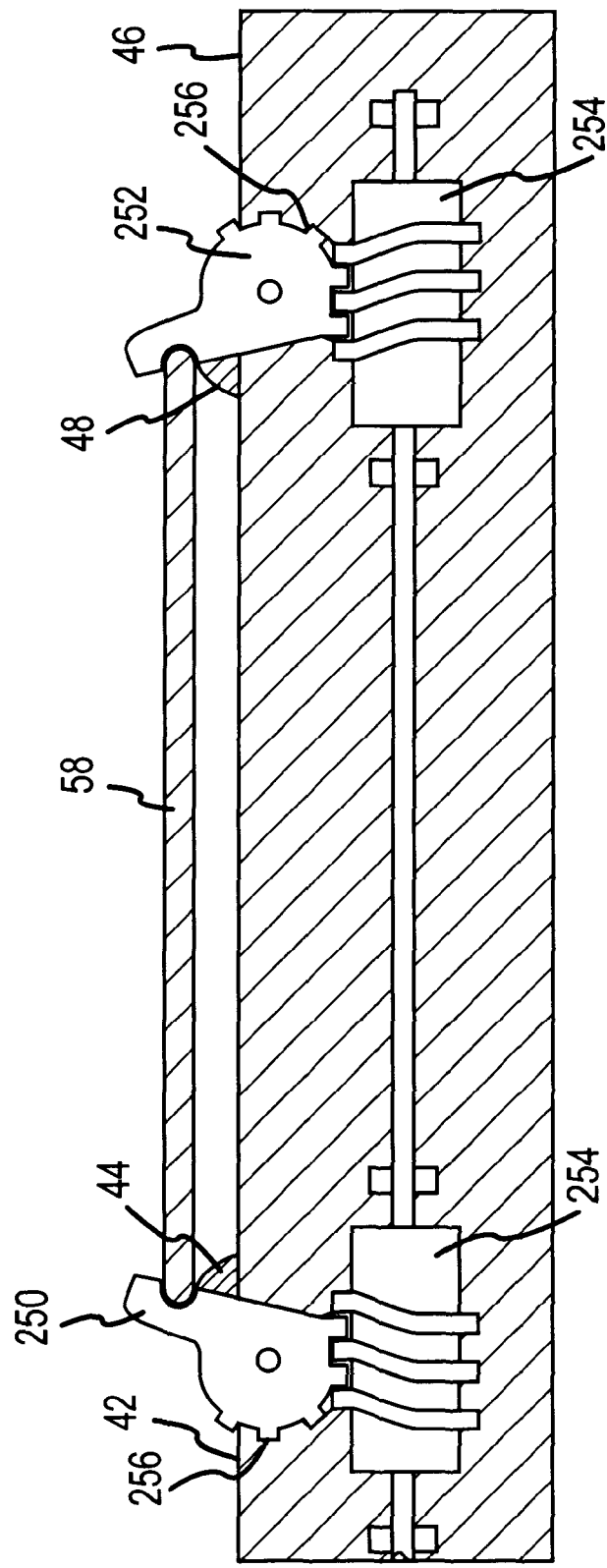
FIG. 8 illustrates schematically, in side view, a mechanism for rotating a base and nose gripper in accordance with a further embodiment of the invention.

In accordance with a preferred embodiment of the invention catch mechanisms 50 and 52 are each spring loaded and are biased by the spring loading to the closed position. Biasing to the closed position provides a desirable fail safe condition so that in the event of power or other failure, the catch mechanisms will remain closed and a wafer on the end-effector will be retained by the catch mechanisms and will not be dropped or displaced. Preferably the two catch mechanisms are operated simultaneously by a single drive mechanism. In accordance with one embodiment of the invention, the drive mechanism includes a drive rod 150 that extends parallel to support rods 36 from base member 32 to nose member 34 as illustrated in FIGS. 1 and 2. Within the base member the drive rod is coupled to an adapter 152 that is engaged with base catch mechanism 50 at a point on the catch mechanism that is offset from axis 54 about which the catch mechanism can rotate. Similarly, within the nose member the drive rod is coupled to an adapter 154 that is engaged with nose catch mechanism 52 at a point 53 on the catch mechanism that is offset from axis 56 about which the catch mechanism can rotate. By pushing on the drive rod, that is, by moving the rod linearly in a direction away from the base member, both catch mechanisms are caused to rotate about their respective axes to an open position. The linear motion of the drive rod can be controlled by compressed air from an air cylinder 156, by a solenoid (not illustrated), or the like. The coupling of the drive rod to nose catch mechanism 52 is illustrated, in partially cut away perspective view, in FIGS. 6 and 7. In FIG. 6 the catch mechanism is in the open position; in FIG. 7 the catch mechanism is in the closed position contacting the edge of wafer 58. In an alternative embodiment, as schematically illustrated in cross section in FIG. 8, a base catch gripper 250 and a nose catch gripper 252 can each be caused to rotate about their respective axes by a worm drive 254 that engages a castellated edge 256 on each of the grippers. The worm drive can be driven by a motor (not illustrated). The grippers can be configured such that when in the open position, the grippers are completely below the upper surface of the base member and the nose member.

In accordance with a further embodiment of the invention, the catch mechanisms are configured to cause a lifting of the workpiece when the catch mechanisms are in the open position. As illustrated, for example, in FIGS. 3 and 4, the catch mechanisms, in accordance with this embodiment, include a lifting surface 158 that extends outwardly from the surface of the rotatable catch mechanism. With the catch mechanism in the open position (FIG. 4) the lifting surface contacts the under surface of wafer 58 and lifts the wafer off plane surface 46 (or raised ridge 48). A similar lifting surface on catch mechanism 50 lifts the wafer off plane surface 42 (or raised ridge 44). As seen in FIGS. 4 and 6, when the catch mechanism is rotated to the open position, all of the catch mechanism except for the lifting surface is substantially at the same level as the plane surface of the base or nose member (or of the raised ridges, if so provided).

Figure 9:
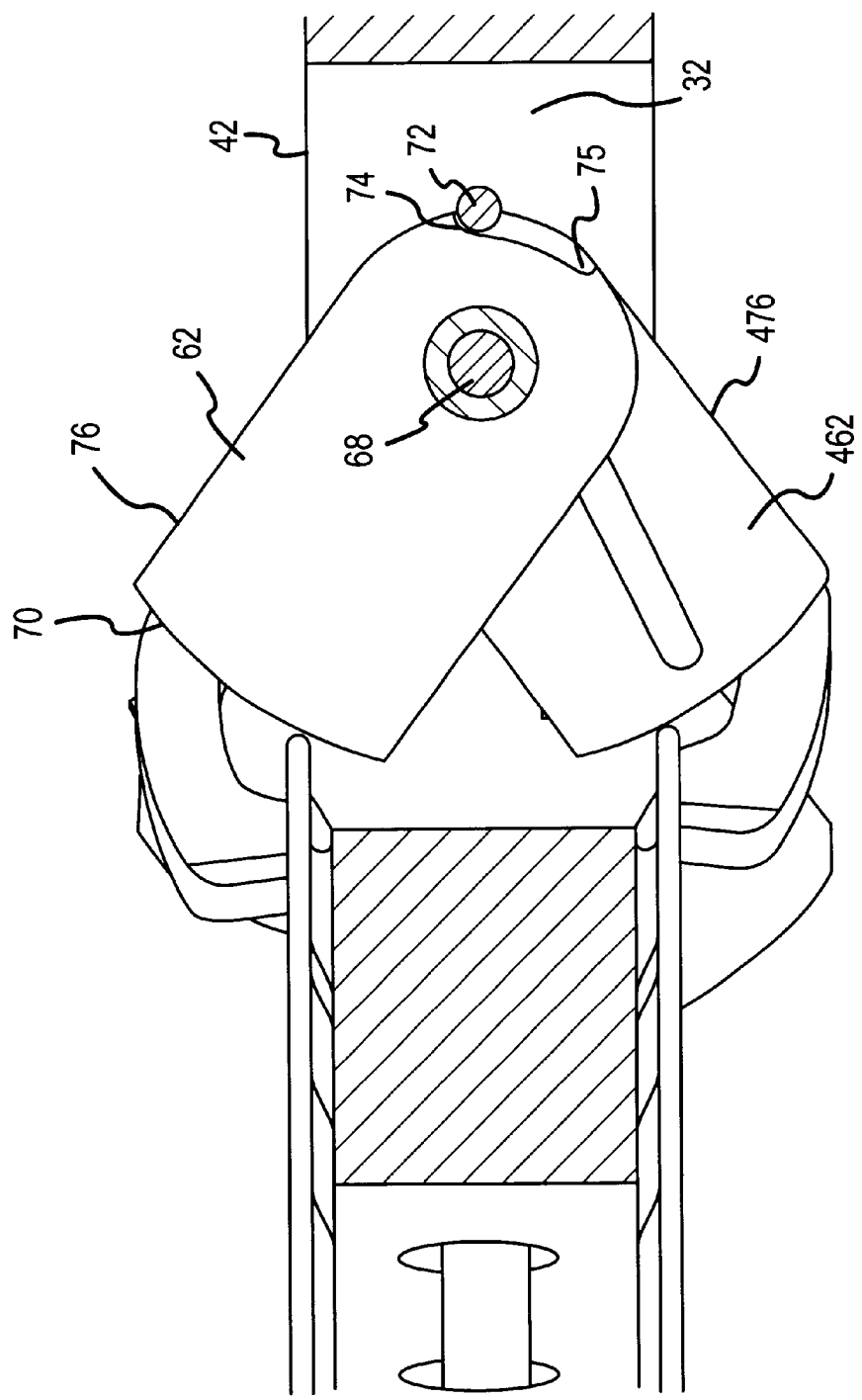
FIGS. 9 and 10 illustrate, in side view, rocker assemblies in accordance with one embodiment of the invention.
Figure 10:
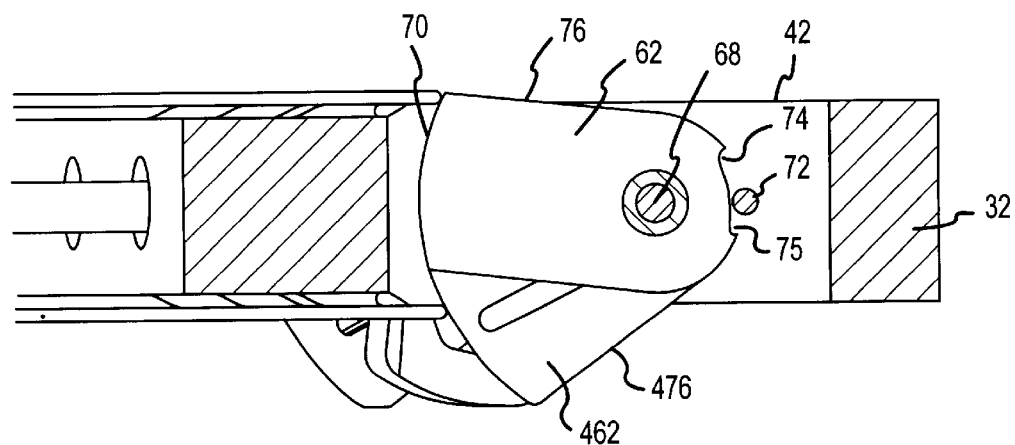

Base member 32 also includes rocker assemblies 60 and 62 and nose member 34 also includes rocker assemblies 64 and 66. The rocker assemblies can all be identical in form and function and are located on the respective base member and nose member so that an arcuate surface of each of the assemblies is in contact with the edge of a wafer positioned on the wafer support area. Each of the rocker assemblies is configured to rotate about an axis from a raised position to a lowered position. For example, as illustrated in FIG. 1, rocker assembly 62 is configured to rotate about an axis 68. The arcuate surface of each of the rocker assemblies is configured so that the arcuate surface remains in contact with the wafer edge as the rocker assembly is rotated between the raised and lowered positions. FIGS. 9 and 10 illustrate, in side view, the contact between arcuate surface 70 of rocker assembly 62 in the extreme raised position and a position near the extreme lowered position, respectively. The rocker assembly is spring loaded with the raised position being the rest position. The rotation of the rocker assembly is limited by a pin 72 that engages stops 74 and 75 on the side of the rocker. In the lowered position side surface 76 of the rocker is at the same level as the upper surface of raised ridge 44 of base 32 or of plane surface 42 if base member is not configured with a raised ridge.

Figure 11:
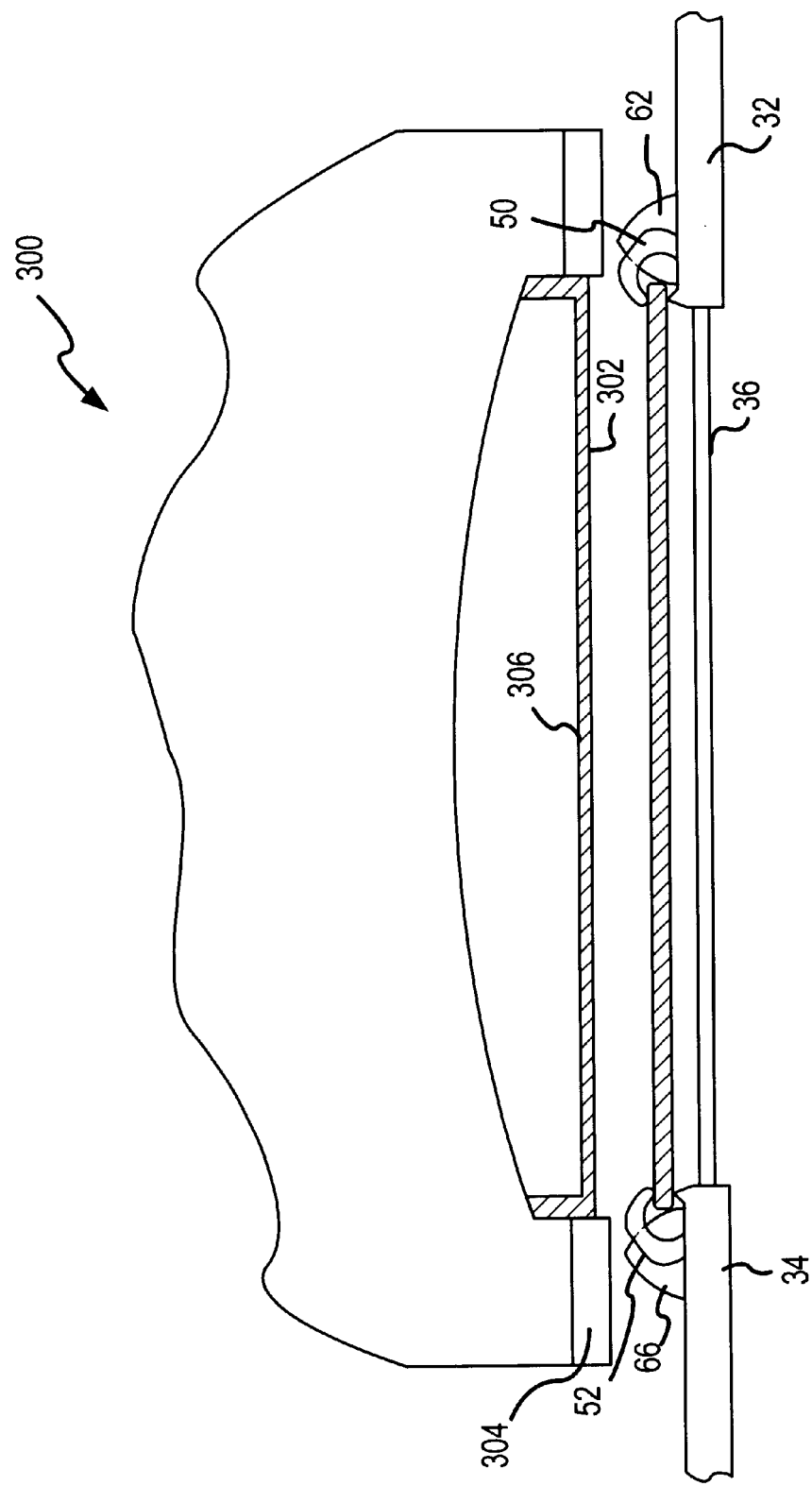
FIG. 11 illustrates schematically, in cross section, positioning of a workpiece handling end-effector and a workpiece located thereon relative to a CMP processing apparatus during a loading operation.

In accordance with an embodiment of the invention, a semiconductor wafer or other workpiece can be loaded into a CMP or other processing apparatus in the following manner. As illustrated in partial cross section in FIG. 11, CMP apparatus 300 includes a recess 302 into which a semiconductor wafer 58 must be loaded. The recess is bounded by a wear ring 304 having an inside diameter only slightly greater than the diameter of the wafer and by a flexible diaphragm 306 against which the wafer will be mounted. Wafer 58 which may have been located in a wafer cache or at a previous processing apparatus is loaded onto workpiece handling end-effector 30. The loading is accomplished by activating drive rod 150 in a first direction to cause the opening of base catch mechanism 50 and nose catch mechanism 52. The robotically controlled end-effector is positioned so that the base and catch mechanisms are located on opposite sides of the wafer and then the drive rod is activated in the opposite direction to cause the catch mechanisms to close and contact opposite edges of the wafer, securely grasping the wafer between the catch mechanisms or between the catch mechanisms and the respective base and nose members. With the wafer securely grasped by the catch mechanisms, the robotically controlled end-effector can be moved to position the wafer below recess 302 and in close vertical proximity to the underside of the CMP apparatus as illustrated in FIG. 11. Drive rod 150 is again activated in the first direction to again cause the opening of the catch mechanisms. In the open position the catch mechanisms are below the upper plane of the end-effector so that the catch mechanisms will not contact wear ring 304 as the end-effector and wafer are moved upward, closer to recess 302. With each of the catch mechanisms in the open position, the wafer is maintained properly centered on the wafer support area of the end-effector by the rocker assemblies, the arcuate surfaces of which contact the edges of the wafer. The robot continues to move the end-effector and the wafer upward, moving the wafer toward recess 302. As the end-effector moves upward, the rocker assemblies contact the lower surface of wear ring 304. As the end-effector continues to move upward, the contact between the rocker assemblies and the wear ring causes the rocker assemblies to rotate, each about its own axis. As the rocker assemblies rotate, the arcuate surfaces of the rocker assemblies continue to contact the edge of the wafer, maintaining the wafer centered on end-effector 30. The robot continues to raise the end-effector until the end-effector is nearly in contact with the wear ring. With the end-effector raised to its maximum upward position, the rocker assemblies are rotated to their extreme lowered position and the upper edges of the assemblies are nearly parallel with the upper surface of the end-effector. With the end-effector raised to its maximum upward position, the wafer is positioned above the plane surface 42 of base member 32 and above plane surface 46 of nose member 34 by the raised ridges on the base member and the nose member and/or by lifting surfaces 158 of catch mechanisms 50. With the end-effector positioned in its maximum upward position and the wafer raised above the plane surfaces of the base and nose members, the wafer is properly lodged within recess 302.

The workpiece handling end-effector, in accordance with the invention, can be used to easily remove a processed workpiece from the processing apparatus. Again with reference to a CMP processing apparatus, following the planarization of the surface of a workpiece, the carrier head of the apparatus, with a workpiece in the carrier head recess, is raised to allow the insertion of a workpiece handling end-effector under the recess. The end-effector is aligned below the recess and the catch mechanisms are rotated to the open position. The alignment of the end-effector with the recess is accomplished by the robot controlling the position of the end-effector. The end-effector is then raised to a position just below the carrier head with the rocker assemblies contacting the wear ring and rotated, in response to the contact with the wear ring, to their lowered position. With the end-effector in this position, the raised ridges on the base member and the nose member and/or the lifting surfaces on the catch mechanisms are in close proximity to the lower surface of the workpiece. The workpiece is then released from the recess in the carrier head of the CMP apparatus and rests on the raised ridges on the base member and the nose member and/or the lifting surfaces on the catch mechanisms. The edges of the workpiece will then be in contact with the arcuate surfaces on the rocker assemblies. The end-effector is then lowered away from the carrier head. As the end-effector is lowered away from contact with the wear ring, the rocker assemblies rotate to their raised position. As the rocker assemblies rotate, the arcuate surfaces of the assemblies maintain the workpiece centered on the workpiece area of the end-effector. When the end-effector is sufficiently below the wear ring to avoid contact with the wear ring, the catch mechanisms are rotated to their closed positions to securely grip the workpiece. The workpiece can then be safely transported to another wafer cache or to a subsequent processing apparatus.

As noted above, in a preferred embodiment end-effector 30 is a double sided end-effector that is capable of grasping a wafer on each of the upper and lower sides of the end-effector. The configuration of the two sides of the end-effector can be identical. The components of the double sided end-effector are illustrated with continued reference to FIGS. 1–4. The lower side of end-effector 30 includes a wafer support area defined between the spaced apart base member 32 and nose member 34 upon which a wafer can be supported similar to wafer support area 40 on the upper side. The lower surfaces of base member 32 and nose member 34 have plane surfaces upon which a wafer can be positioned. In accordance with one embodiment of the invention, the base member and nose member also have raised ridges extending upwardly from the plane surfaces to provide a limited area surface for contacting a limited area on the surface of the wafer.

The base member and nose member also includes catch mechanisms 450 and 452, each of which is configured to rotate between closed and open positions about an axis passing through the catch mechanism. The two catch mechanisms are positioned to contact opposite edges of a wafer and to secure the wafer between the catch mechanisms. The contact mechanisms can have contacting surfaces 470 which, as illustrated for example in FIG. 4, when the catch mechanism is in the closed position, contacts the outer portion of the lower surface of a wafer 458 and hold the wafer against the base member or the nose member, as the case may be. Alternatively, the catch mechanism can be configured with a concave surface (not illustrated) similar to concave surface 172 on catch mechanism 171 for grasping the edge of the wafer.

As with the catch mechanisms on the upper side of the end-effector, the catch mechanisms on the lower side of the end-effector are preferably spring loaded and are biased in the closed position. The catch mechanisms on the base member and the nose member can be operated simultaneously by a drive rod 460 that extends parallel to support rods 36 from the base member to the nose member. The drive rod can be coupled to the catch mechanisms by adapters that are engaged with the catch mechanisms at a point on the catch mechanism that is offset from the axis about which the catch mechanism rotates. By pushing on the drive rod, that is, by moving the rod linearly in a direction away from the base member, both catch mechanism can be made to rotate about their respective axes to an open position. The linear motion of drive rod 460 can be controlled in the same manner as is the motion of drive rod 150.

Preferably, the catch mechanisms on the lower side of the end-effector are also configured to cause a lifting of the wafer 458 when the catch mechanisms are in the open position. In accordance with this preference, the catch mechanisms include a lifting surface 478 that extends outwardly from the surface of the rotatable catch mechanisms. With the catch mechanisms in the open position the lifting surfaces contact the surface of wafer 458 and lift the wafer off the plane surfaces (or alternatively off the raised ridges) of the base member and the nose member. Although not illustrated in any of the figures, when the catch mechanisms are in the open position, all of the catch mechanisms except for the lifting surfaces are substantially even with the plane surface of the base and nose members, as the case may be, or with the raised ridges, if so provided.

In the same manner as for the upper side of the end-effector, base member 32 also includes rocker assemblies 460 and 462 and nose member 34 also includes rocker assemblies 464 and 466 that are operative on the lower side of the end-effector. The rocker assemblies can all be identical in form and function to the rocker assemblies operative on the upper side of the end-effector and are located on the respective base member and nose member so that an arcuate surface of each of the assemblies is in contact with the edge of a wafer positioned on the wafer support area. Each of the rocker assemblies is configured to rotate about an axis from a raised position to a lowered position. The arcuate surface of each of the rocker assemblies is configured so that the arcuate surface remains in contact with the wafer edge as the rocker assembly is rotated between the raised and lowered positions. The rocker assemblies are spring loaded with the raised position being the rest position. As illustrated in FIGS. 9 and 10, in the lowered position side surface 476 of the rocker is at substantially the same level as the upper surface of raised ridge on the lower side of base 32 or of plane surface of the base member or nose member if base member and nose member are not configured with a raised ridge.

In accordance with one embodiment of the invention, a two sided workpiece handling end-effector, in accordance with the invention, can be used in an efficient manner for the loading and unloading of workpieces into and from a processing apparatus. In this manner the processing of workpieces can be accomplished efficiently. A first unprocessed workpiece can be moved from a workpiece cache or other location and loaded into a workpiece processing apparatus, such as a CMP apparatus, on one side of a two sided workpiece handling end-effector in the same manner as described above. While that first workpiece is being processed by the workpiece processing apparatus, a second unprocessed workpiece can be retrieved from a workpiece cache on the first side of a two sided end-effector. At the completion of the processing of the first workpiece, that first workpiece, now processed, can be unloaded from the workpiece processing apparatus onto the second side of the two sided workpiece handling end-effector. The unloading operation can be accomplished in the same manner as described above for the unloading of a workpiece (wafer) from a CMP processing apparatus. The end-effector can then be rotated by 180° about an axis extending from base member to the nose member in order to position the second workpiece below the workpiece processing apparatus. The second workpiece is then aligned with the recess in the processing apparatus and subsequently loaded into the processing apparatus in the same manner as described above. While the second workpiece is being processed by the workpiece processing apparatus, the workpiece handling end-effector can transport the processed first workpiece to a workpiece cache or to a subsequent processing apparatus and can retrieve a third unprocessed workpiece from the workpiece cache. The process can then be repeated with additional workpieces.

In accordance with another embodiment of the invention, sensors are incorporated into the end-effector to help insure proper operation of the end-effector and to help avoid mishandling and possible damage to a potentially valuable workpiece. As illustrated in FIG. 1 and as shown partially in FIG. 2, a sensor cable assembly 560 can be built into base member 32. In accordance with one embodiment, the sensor cable assembly includes two sensors operative on each side of the workpiece handling end-effector. On the upper side of the end-effector, sensor 502 is capable of detecting the presence of a properly positioned workpiece on the end-effector and sensor 504 is capable of indirectly detecting the state of the catch mechanisms, i.e., whether the catch mechanisms are in the open or closed position. In a similar manner sensor 506 is capable of detecting the presence of a workpiece on the lower side of the end-effector and sensor 508 is capable of indirectly detecting the state of the catch mechanisms on the lower side of the end-effector. Each of the sensors can be, for example, an inductive or capacitive sensor. Sensor 502 is positioned in proximity to plane surface 42 of base member 32. The presence of a workpiece on the base member changes the inductive or capacitive coupling to the sensor by deflecting a proximity trigger spring (not shown), and a signal is generated that is coupled through sensor cable assembly 500 to a process controller (not illustrated). In a similar manner sensor 506 is mounted in proximity to the plane surface on the lower side of base member 32 to detect a workpiece on that plane surface. The sensors 502 and 506 and associated proximity trigger springs are configured such that only a properly positioned wafer will cause a signal to be generated. Therefore in addition to wafer presence, sensors 502 and 506 also detect an improperly positioned wafer by not generating a signal when the wafer is present but misaligned. Sensor 504 is positioned adjacent to a coupler 510 that is coupled to drive rod 150. When drive rod 150 is pushed to cause the opening of catch mechanisms 50 and 52, the position of coupler 510 with respect to sensor 504 is changed, changing the inductive or capacitive coupling between the coupler and the sensor. This change in inductive or capacitive coupling causes the generation of a signal that can be coupled to the process controller. In a similar manner, sensor 508 is positioned adjacent to coupler 512 in base member 32 that is coupled to drive rod 460 and is capable of detecting changes in the position of that coupler and hence in the state of the catch mechanisms on the lower side of the end-effector. The two sensors on the top side of the end-effector, like the two sensors on the lower side of the end-effector, can be used together to detect the proper positioning of a workpiece and the proper operation of the catch mechanisms.

Thus it is apparent that there has been provided, in accordance with the invention, a workpiece handling end-effector and a method for processing workpieces using such an end-effector that fully meets the needs set forth above. Although the invention has been described with reference to certain illustrative embodiments thereof, it is not intended that the invention be limited to these embodiments. Those of skill in the art will recognize that many variations and modifications exist that do not depart from the true spirit of the invention. For purposes of illustration only, the invention has been described with reference to a workpiece handling end-effector that has been optimized for handling a semiconductor wafer and specifically for handling a semiconductor wafer in a CMP process. The invention is not to be limited to its application to semiconductor wafers or to a CMP process. Rather the invention is applicable to a broad range of workpieces and to a broad range of processes performed on such workpieces. Accordingly, it is intended to include within the invention all such variations and modifications as fall within the scope of the appended claims.

What is claimed is:

1. A workpiece handling end-effector for loading an unprocessed workpiece into a workpiece processing apparatus and for unloading a processed workpiece from the workpiece processing apparatus, the workpiece handling end-effector comprising:

an elongate gripping assembly;

a first base portion of the elongate gripping assembly configured for attachment to a robotically controlled arm;

a second base portion of the elongate gripping assembly spaced apart from the first base portion;

a first catch mechanism configured to rotate about a first axis from a closed position to an open position, the first axis coupled to the first base portion;

a second catch mechanism configured to rotate about a second axis from a closed position to an open position, the second axis coupled to the second base portion, a control mechanism coupled to the first catch mechanism and to the second catch mechanism and capable of causing the first catch mechanism and the second catch mechanism to simultaneously rotate from a closed position in which the first catch mechanism and the second catch mechanism are capable of securing a workpiece to the workpiece handling end-effector to an open position in which the first catch mechanism and the second catch mechanism do not secure the workpiece to the workpiece handling end-effector; and first and second rocker assemblies located at the first base portion and third and fourth rocker assemblies located at the second base portion, each of the rocker assemblies having an arcuate surface and each of the rocker assemblies located to position the arcuate surface in contact with an edge of a workpiece when such workpiece is positioned on the workpiece handling end-effector, each of the rocker assemblies rotatable about an axis through the respective rocker assembly in response to the workpiece handling end-effector contacting a workpiece processing apparatus, the arcuate surfaces configured to remain in contact with the edge of the workpiece as the rocker assembly rotates about the axis.

2. The workpiece handling end-effector of claim 1 wherein the first base portion comprises a first substantially planar surface and the first catch mechanism is coupled to the first base portion so that in the open position the first catch mechanism is positioned substantially below the first substantially planar surface; and the second base portion comprises a second substantially planar surface and the second catch mechanism is coupled to the second base portion so that in the open position the second catch mechanism is positioned substantially below the second substantially planar surface.

3. The workpiece handling end-effector of claim 1 wherein the first base portion comprises a first substantially planar surface and the second base portion comprises a second substantially planar surface, the workpiece handling end-effector further comprising a first raised ridge extending upwardly from the first substantially planar surface and a second raised ridge extending upwardly from the second substantially planar surface, the first and second raised ridges configured to contact only an area of a surface of a workpiece positioned on the workpiece handling end-effector, the area limited to the outer 2 mm of the surface.

4. The workpiece handling end-effector of claim 1 wherein each of the first catch mechanism and the second catch mechanism comprises a contacting surface configured to contact an outer portion of a surface of a workpiece positioned on the workpiece handling end-effector, the outer portion limited to an area within 2 mm of the outer periphery of the workpiece.

5. The workpiece handling end-effector of claim 1 wherein each of the first catch mechanism and the second catch mechanism comprises a concave surface configured to span the edge of a workpiece positioned on the workpiece handling end-effector.

6. The workpiece handling end-effector of claim 1 wherein the control mechanism comprises a drive rod coupled to a first adapter and to a second adapter, the first adapter coupled to the first catch mechanism at a location spaced apart from the first axis and the second adapter coupled to the second catch mechanism at a location spaced apart from the second axis.

7. The workpiece handling end-effector of claim 1 wherein the control mechanism comprises a drive rod having a first worm gear and a second worm gear coupled thereto, the first worm gear operatively coupled to a first castellated surface on the first catch mechanism and the second worm gear operatively coupled to a second castellated surface on the second catch mechanism.

8. The workpiece handling end-effector of claim 1 further comprising a sensor system configured to detect the presence of a workpiece located on the workpiece handling end-effector and to detect the position of the first and second catch mechanisms.

9. The workpiece handling end-effector of claim 1 wherein the first and second catch mechanisms each comprise a lifting surface configured, when the first and second catch mechanisms are in the open position, to lift a workpiece out of contact with the first base portion and the second base portion.

10. A workpiece handling end-effector having a first side and a second side, the workpiece handling end-effector comprising:

first and second catch mechanisms spaced apart on opposite sides of a workpiece area on the first side, each of the first and second catch mechanisms configured to rotate between a closed orientation capable of securing a workpiece to the first side and an open orientation;

third and fourth catch mechanisms spaced apart on opposite sides of a second workpiece area on the second side, each of the third and fourth catch mechanisms configured to rotate between a closed orientation capable of securing a workpiece to the second side and an open orientation;

a first drive mechanism coupled to the first and second catch mechanisms and capable of causing the first and second catch mechanisms to simultaneously rotate between the closed and open orientations; and a second drive mechanism coupled to the third and fourth catch mechanisms and capable of causing the third and fourth catch mechanisms to simultaneously rotate between the closed and open orientations.

11. The workpiece handling end-effector of claim 10 wherein each of the first, second, third, and fourth catch mechanisms comprises a concave surface configured to contact the edge of a workpiece positioned on the workpiece handling end-effector.

12. The workpiece handling end-effector of claim 11 wherein each of the first, second, third, and fourth catch mechanisms further comprises a lifting surface configured, when the first, second, third, and fourth catch mechanisms are in the open position, to lift a workpiece.

13. The workpiece handling end-effector of claim 10 wherein each of the first, second, third, and fourth catch mechanisms comprises a contacting surface configured, in the closed position, to contact an outer portion of a surface of a workpiece positioned on the workpiece handling end-effector, the outer portion limited to an area within 2 mm of the outer periphery of the workpiece.

14. The workpiece handling end-effector of claim 13 wherein each of the first, second, third, and fourth catch mechanisms further comprises a lifting surface configured, when the first, second, third, and fourth catch mechanisms are in the open position, to lift a workpiece.

15. The workpiece handling end-effector of claim 10 further comprising rocker assemblies positioned on each of the first and second sides, the rocker assemblies configured to position a workpiece on the workpiece handling end-effector when the first, second, third, and fourth catch mechanisms are in the open position.

16. The workpiece handling end-effector of claim 15 wherein the rocker assemblies are each configured to rotate in response to contacting a workpiece processing apparatus.

17. The workpiece handling end-effector of claim 15 wherein the rocker assemblies each comprise an arcuate surface configured to contact a workpiece on the workpiece handling end-effector.

18. The workpiece handling end-effector of claim 17 wherein the rocker assemblies are each configured to rotate in response to contacting a workpiece processing apparatus and the arcuate surfaces are configured to remain in contact with a workpiece on the workpiece handling end-effector as the workpiece assemblies rotate.

19. A workpiece handling end-effector for loading an unprocessed workpiece into a workpiece processing apparatus and for unloading a processed workpiece from the workpiece processing apparatus, the workpiece handling end-effector comprising:
    an elongate gripping assembly;
    a first base portion of the gripping assembly configured for attachment to a robotically controlled arm;
    a second base portion of the gripping assembly spaced apart from the first base portion;
    a first catch mechanism configured to rotate about a first axis from a closed position to an open position, the first axis coupled to the first base portion;
    a second catch mechanism configured to rotate about a second axis from a closed position to an open position, the second axis coupled to the second base portion;
    a control mechanism coupled to the first catch mechanism and to the second catch mechanism and capable of causing the first catch mechanism and the second catch mechanism to simultaneously rotate from a closed position in which the first catch mechanism and the second catch mechanism are capable of securing a workpiece to the workpiece handling end-effector to an open position in which the first catch mechanism and the second catch mechanism do not secure the workpiece to the workpiece handling end-effector, the first catch mechanism and the second catch mechanism each further configured to be completely below the workpiece when in the open position; and
    a first workpiece centering assembly located at the first base portion and a second workpiece centering assembly located at the second base portion.

20. The workpiece handling end-effector of claim 19, wherein the first workpiece centering assembly comprises first and second pivoting rockers having arcuate faces for contacting the edge of the workpiece proximate the first base portion of the gripping assembly, and wherein the second workpiece centering assembly comprises third and fourth pivoting rockers having arcuate faces for contacting the edge of the workpiece proximate the second base portion of the gripping assembly.

21. An end-effector for gripping a semiconductor wafer at its edge, comprising:
    an elongated gripping assembly having a first end adapted for attachment to a controllable robot, and a second end opposite the first end;
    a first actuated wafer edge clamping assembly proximate the first end of the gripping assembly, and moveable between an open position and a wafer clamp position;
    a second actuated wafer edge clamping assembly proximate the second end of the gripping assembly, and moveable between an open position and a wafer clamp position; and
    first and second elevated wafer supports proximate the first and second ends respectively of the elongate gripping assembly, and configured to support the wafer on its edges with the wafer in a static position atop the first and second elevated wafer supports, wherein the wafer edge clamp assemblies are entirely beneath the wafer when in the open position.

22. The end-effector of claim 21, further comprising a sensor for detecting the presence of a workpiece in the end-effector.

23. A two sided end-effector for gripping two semiconductor wafers at their edges, comprising:
    an elongated gripping assembly having a first end adapted for attachment to a controllable robot, a second end opposite the first end, and first and second opposed major surfaces;
    a first actuated wafer edge clamping assembly disposed about the first and second ends of the gripping assembly adjacent the first major surface thereof, and moveable between an open position and a wafer clamp position to clamp a first semiconductor wafer adjacent the first major surface when the first actuated wafer edge clamping assembly is in a wafer clamping position; and
    a second actuated wafer edge clamping assembly disposed about the first and second ends of the gripping assembly adjacent the second major surface thereof, and moveable between an open position and a wafer clamp position to clamp a second semiconductor wafer adjacent the second major surface when the second actuated wafer edge clamping assembly is in a wafer clamping position.

24. The two-sided end-effector of claim 23, wherein the first and second wafer edge clamping assemblies comprise a first set of clamps that pivot about an axis coupled to the first end of the gripping assembly, and a second set of clamps that pivot about an axis coupled to the second end of the gripping assembly.

25. An end-effector for gripping a semiconductor wafer at its edge, comprising:
    an elongated gripping assembly having a first end adapted for attachment to a controllable robot, a second end opposite the first end, and first and second opposed major surfaces;
    a first actuated wafer edge clamping assembly proximate the first end of the gripping assembly adjacent the first major surface thereof, and moveable between an open position and a wafer clamp position;
    a second actuated wafer edge clamping assembly proximate the second end of the gripping assembly adjacent the first major surface thereof, and moveable between an open position and a wafer clamp position, the first actuated wafer edge clamping assembly and the second actuated wafer edge clamping assembly configured to clamp a first semiconductor wafer therebetween adjacent the first major surface when in the wafer clamp position;
    a third actuated wafer edge clamping assembly proximate the first end of the gripping assembly adjacent the second major surface thereof, and moveable between an open position and a wafer clamp position; and
    a fourth actuated wafer edge clamping assembly proximate the second end of the gripping assembly adjacent the second major surface thereof, and moveable between an open position and a wafer clamp position, the third actuated wafer edge clamping assembly and the fourth actuated wafer edge clamping assembly configured to clamp a second semiconductor wafer therebetween adjacent the second opposed major surface when in the wafer clamp position.

* * * * *